United States Patent
Curtis

Patent Number: 6,014,409
Date of Patent: Jan. 11, 2000

[54] PASSIVE ANALOG FILTER FOR NETWORK INTERFACE

[75] Inventor: Robert Curtis, Hudson, Mass.

[73] Assignee: Cabletron Systems, Inc., Rochester, N.H.

[21] Appl. No.: 08/796,072

[22] Filed: Feb. 5, 1997

[51] Int. Cl.[7] .............................. H04B 3/00; H04B 3/04; H04L 25/00; H03H 7/38

[52] U.S. Cl. ...................... 375/257; 375/258; 333/20; 333/32; 333/167; 333/172; 333/177

[58] Field of Search .................................. 375/257, 258; 333/20, 32, 167, 172, 177, 178

[56] References Cited

U.S. PATENT DOCUMENTS

| | | | |
|---|---|---|---|
| 4,875,223 | 10/1989 | Curtis | 375/258 |
| 5,410,535 | 4/1995 | Yang et al. | |
| 5,541,957 | 7/1996 | Lau | 375/258 |
| 5,544,323 | 8/1996 | Heaton et al. | 395/200.14 |
| 5,577,069 | 11/1996 | Lau et al. | |
| 5,586,117 | 12/1996 | Edem et al. | |
| 5,596,575 | 1/1997 | Yang et al. | 370/468 |
| 5,715,287 | 2/1998 | Wadhawan et al. | 375/377 |
| 5,739,707 | 4/1998 | Barraclough | 327/112 |
| 5,747,893 | 5/1998 | Bennett et al. | 307/100 |
| 5,754,552 | 5/1998 | Allmond et al. | 370/465 |
| 5,764,394 | 6/1998 | Yamazaki et al. | 359/152 |
| 5,784,408 | 7/1998 | Lau | 375/258 |
| 5,799,040 | 8/1998 | Lau | 375/258 |

OTHER PUBLICATIONS

"Hybrid Buterworth Filter Module," IBM Technical Disclosure Bulletin, vol. 28, No. 5, Oct. 1985, New York USA, pp. 2164–2165, XP002067554.

*Asante 100 Megabit Fast Ethernet White Paper,* Asante and 100BASE–T Fast Ethernet, *A Whitepaper by Asante Technologies, Inc.;* pp. 1–6, Jan. 14, 1997, http://www.asante.com/Press/wpfast.html, Copyright 1994–1995.

*Primary Examiner*—Stephen Chin
*Assistant Examiner*—Michael W. Maddox
*Attorney, Agent, or Firm*—Wolf, Greenfield & Sacks, P.C.

[57] ABSTRACT

A network interface for receiving both high speed signals and low speed signals includes a passive filter manufactured entirely from passive electronic elements. The filter filters the low speed signal when a low speed signal is received, and does not distort a high speed signal transmitted to an encoder/decoder device when a high speed signal is received.

21 Claims, 4 Drawing Sheets

PASSIVE ANALOG FILTER FOR NETWORK INTERFACE

FIELD OF THE INVENTION

This invention generally relates to data transmission networks and, more particularly, to filters used with network interfaces.

BACKGROUND OF THE INVENTION

A local area network ("LAN") is a high-speed data communication system that electronically links computers and other data processing devices located within a small geographic area. Such small geographic areas may include a workgroup, a department of a company, or a single floor of a multistory building. Among other useful functions, LANs enable users to share vital computing resources, such as servers, printers, and CD-ROM drives. LANs also can serve as a secure broadcast domain for users connected to the LAN.

Data processing devices in a LAN exchange both data and control information in conformance with fixed protocols that define the operation of the network. One such commonly used class of network protocols is the "Carrier Sense Multiple Access with Collision Detection" protocol (CSMA/CD). The CSMA/CD protocol is defined in ANSI/IEEE Std. 802.3, published by the Institute of Electrical and Electronics Engineers, Inc., 345 East 45th Street, New York, N.Y., 10017, and commonly referred to as "the IEEE standards."

Ethernet is one widely-used CSMA/CD protocol, having several types such as 10Base-T and 100Base-TX which also are defined in IEEE standard 802.3. 100Base-TX technology is an improved version of 10Base-T technology, which has been in widespread use for many years. Specifically, the 10Base-T protocol of IEEE standard 802.3 is concerned with transferring data at a rate of 10 megabits per second over twisted-pair copper cables. Consider, for example, a LAN having two computers that can transfer data at 10 megabits per second only. Before one of the computers (the transmitting computer) can begin transmitting data to the other (the receiving computer), the transmitting computer first must establish that there is a 10Base-T communication link associated with the receiving computer. This typically is accomplished by means of link pulses that each computer transmits directly after power-up during out-of band periods (i.e. the time when the computers are not transmitting data packets and control information related to the data packets). The link pulses, commonly termed "normal" link pulses, consist of 100 nanosecond pulses every 16 milliseconds +/− 8 milliseconds. After power-up, the transmitting computer monitors the link for normal link pulses. When the transmitting computer receives a predetermined number of normal link pulses, thereby indicating the presence of a link that is capable of transmitting data to the receiving computer at the 10Base-T rate, the transmitting computer begins transmitting data across the LAN to the receiving computer.

The 100Base-TX protocol (commonly referred to as "Fast Ethernet") expands the IEEE standard 802.3 for 10Base-T communications to allow data to move at an effective rate of 100 megabits per second through twisted pair copper cables of the type that typically are used for 10Base-T transmissions. The 100Base-TX protocol therefore transmits data at 10 times the rate of existing 10Base-T systems and thus, is more desirable to use than the existing 10Base-T protocol. Many existing computer systems and data transfer devices, however, only have a network interface for 10Base-T transmissions. Such devices consequently cannot utilize the improved 100Base-TX protocol. The art has responded to this problem by developing upgraded network interfaces (commonly referred to as "10/100 interfaces") to existing 10Base-T network interfaces that enable data transfer devices to interface with networks using either 10Base-T Ethernet or 100Base-TX Ethernet.

10/100 interfaces can be connected to the Peripheral Component Interconnect (PCI) bus in a data transmission device such as, for example, a personal computer. A 10/100 interface has a data receiving input port that connects to both an encoder/decoder device and a filtering device. Both the encoder/decoder device and filtering device are connected to a PCI bus interface. When a 10Base-T signal is received by the input port, for example, the filtering device filters noise out of the signal and transmits it to the PCI bus interface. Conversely, when a 100Base-TX signal is received at the input port, the encoder/decoder processes the signal and then transmits it to the PCI bus interface. The 10Base-T signal is not transmitted by the encoder/decoder and the 100Base-TX signal is not transmitted by the filtering device.

It is known that the filtering device, which typically is connected in parallel with the encoder/decoder, must be configured to eliminate any distorting effect on a 100Base-TX input signal as it is transmitted between the input port and the encoder/decoder. A first known solution requires a buffering device, manufactured from active electronic elements, to be connected between the filtering device and the encoder/decoder. This enables the filter to receive the 10Base-T signal without distorting a 100Base-TX signal transmitted into the encoder/decoder. The additional active buffering device, however, increases the cost of the overall device. Another known solution requires that filtering device be manufactured from active electronic elements. One such active filter used for these purposes is the Pericom p15L100 chip, available from Pericom Semiconductor Corporation of San Jose, Calif. Similar to devices using an active buffering device, however, a filter manufactured from active electronic elements typically is expensive to manufacture and, consequently, increases the overall cost of the 10/100 interface.

Accordingly, it would be desirable to provide an inexpensive filtering device for a 10/100 interface device that is constructed to effectively filter noise from a 10Base-T signal when a 10Base-T signal is received, but does not distort a 100Base-TX signal transmitted between the network input port and the encoder/decoder when a 100Base-TX signal is received.

SUMMARY OF THE INVENTION

In accordance with the principles of the invention, a network interface for both a high speed and low speed signal uses a filtering device comprised entirely of passive elements to filter the low speed signal, thereby reducing the overall cost of the interface. The passive filter, which may be manufactured from resistors, capacitors, and inductors, is a low pass filter that can transmit a low speed signal when the low speed signal is received, but does not distort a high speed signal transmitted between a network input port and the encoder/decoder. The passive filter has a substantially constant input impedance over the operating frequencies of the high speed signal.

It is among the objects of the invention to provide an inexpensive network interface that may receive high speed and low speed network signals.

It is another object of the invention to provide a network interface for receiving high speed and low speed network signals in which the interface includes a receive filter comprised entirely of passive electronic elements.

It is also an object of the invention to provide a network interface for receiving high speed and low speed network signals in which the interface includes a passive receive filter that has a substantially constant input impedance over the operating frequencies of the high speed signal.

BRIEF DESCRIPTION OF THE DRAWINGS

The above and further advantages of the invention may be better understood by referring to the following description in conjunction with the accompanying drawings in which.

DETAILED DESCRIPTION OF A PREFERRED EMBODIMENT

Figure 1:
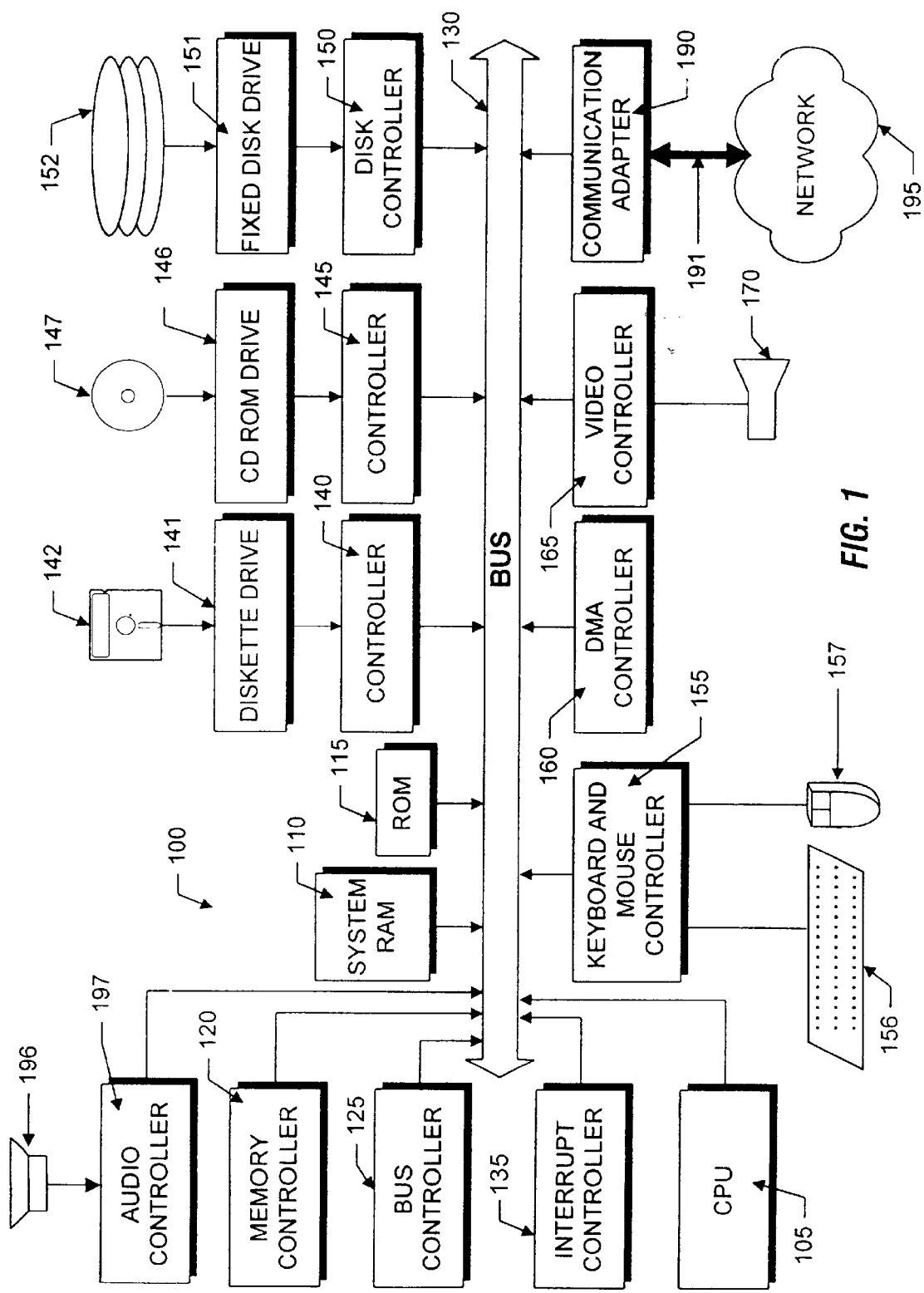
FIG. 1 is a block diagram of a computer system suitable for use with the present invention.

FIG. 1 illustrates the system architecture for an exemplary computer system 100, such as an IBM PS/2® computer, on which the invention can be implemented. The exemplary computer system of FIG. 1 is for descriptive purposes only, however, and should not be considered a limitation of the invention. Although the description below may refer to terms commonly used in describing particular computer systems, such as an IBM PS/2 computer, the described concepts apply equally to other systems, including systems having architectures that are dissimilar to that shown in FIG. 1.

The computer system 100 includes a central processing unit (CPU) 105, which may include a conventional microprocessor, random access memory (RAM) 110 for temporary storage of information, and read only memory (ROM) 115 for permanent storage of information. A memory controller 120 is provided for controlling system RAM 110. A bus controller 125 is provided for controlling a bus 130, and an interrupt controller 135 is used for receiving and processing various interrupt signals from the other system components.

Mass storage may be provided by diskette 142, CD-ROM 147, or hard disk 152. Data and software may be exchanged with computer system 100 via removable media, such as diskette 142 and CD-ROM 147. Diskette 142 is insertable into diskette drive 141, which is connected to bus 130 by controller 140. Similarly, CD-ROM 147 is insertable into CD-ROM drive 146, which is connected to bus 130 by controller 145. Finally, a hard disk 152 is part of a fixed disk drive 151, which is connected to bus 130 by controller 150.

User input to computer system 100 may be provided by a number of devices. For example, a keyboard 156 and a mouse 157 are connected to bus 130 by a keyboard and mouse controller 155. An audio transducer 196, which may act as both a microphone and a speaker, is connected to bus 130 by audio controller 197. It should be obvious to those reasonably skilled in the art that other input devices such as a pen and/or tablet and a microphone for voice input may be connected to computer system 100 through bus 130 and an appropriate controller. DMA controller 160 is provided for performing direct memory access to system RAM 110. A visual display is generated by a video controller 165, which controls video display 170. Computer system 100 also includes a network interface 200 which allows the system to be interconnected to a network 195 via bus 191. The network 195 may be a local area network (LAN) or a wide area network (WAN).

Computer system 100 generally is controlled and coordinated by operating system software, such as the OS/2® operating system (available from the International Business Machines Corporation, Boca Raton, Fla.) or WINDOWS®NT (available from Microsoft Corp., Redmond, Wash.). Among other computer system control functions, the operating system controls allocation of system resources and performs tasks such as process scheduling, memory management, networking and I/O services.

Figure 2:
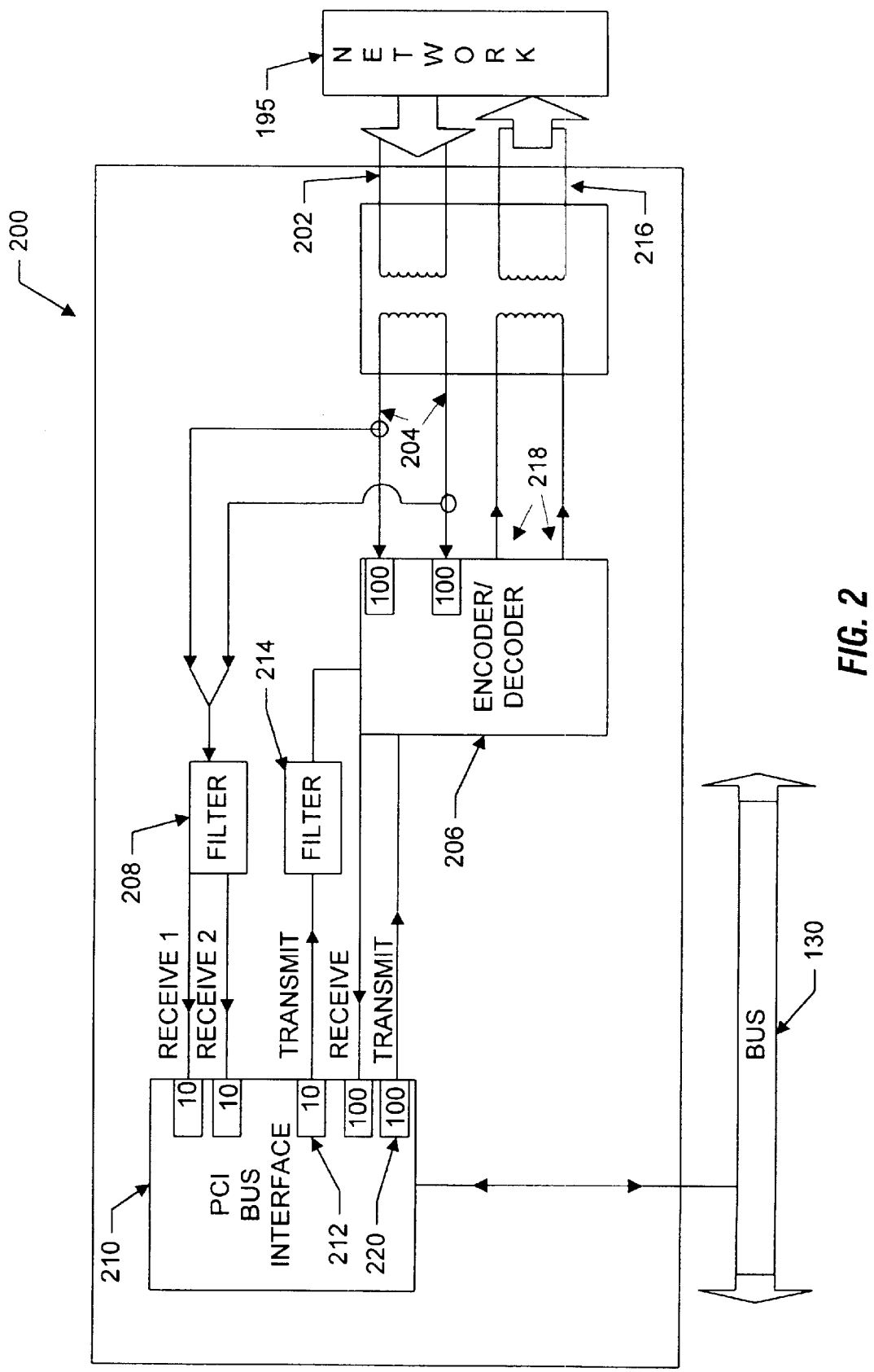
FIG. 2 is a block schematic diagram of the 10/100 network interface in accordance with the invention.

FIG. 2 shows an inventive network interface 200 device for receiving either a high speed signal or a low speed signal from a local area network 195. In the preferred embodiment, the high speed signal is a 100Base-TX Ethernet signal and the low speed signal is a 10Base-T Ethernet signal. The network interface 200 is physically connected between the network 195 and the bus 130 to provide an interface for converting an incoming network signal into a form that can be read by the computer system 100. Although the bus 130 for computer system 100 is shown, any other network device, such as a switch or bridge, may be used with the inventive network interface 200.

The network interface 200 includes an interface input port 202 for receiving an input data signal and an input line 204 extending from the input port 202. The interface input port 202 may be a 1:1 pulse transformer that electrically isolates the interface circuitry 200 from the network 195. The input line 204 extends from the input port 202 to a conventional 100Base-TX encoder/decoder device 206 that processes a 100Base-TX signal only. A 10Base-T low pass receive filter 301 also is connected to the input line 204 to filter noise from a 10Base-T signal. Both the receive filter 301 and encoder/decoder 206 are connected to a conventional PCI-bus interface 210 which receives either the 10Base-T signal from the receive filter 301, or the 100Base-TX signal from the encoder/decoder 206. The PCI-bus interface 210 transmits processed input signals (i.e., either 10Base-T or 100Base-TX signals) to the bus 130 for use by the computer system 100. Accordingly, when a 10Base-T signal is received by the input port 202, the receive filter 301 filters noise out of the signal and transmits it to the PCI bus 130 via interface 210. Conversely, when a 100Base-TX signal is received at the input port 202, the encoder/decoder 206 processes the signal and then transmits the processed signal to the PCI bus interface 210.

The PCI-bus interface 210 also includes a 10Base-T transmit port 212 which transmits 10Base-T signals received from the bus 130 to a 10Base-T transmit filter 214. This filtered 10Base-T signal then is fed into the encoder/decoder 206, which transmits it to an interface transmit port 216 via an encoder/decoder transmit port 218. The interface transmit port 216 may be a 1:1 pulse transformer that electrically isolates the network interface 200 from the network 195. The signal then is transmitted to the network 195 through the interface transmission port 216. The PCI-bus interface 210 similarly includes a 100Base-TX transmit port 220 which transmits 100Base-TX signals received from the bus 130 directly to the encoder/decoder 206. Such 100Base-TX signals then are transmitted to the interface transmit port 216, via the encoder/decoder transmit port 218, which then transmits the signal to the network 195.

Figure 3:
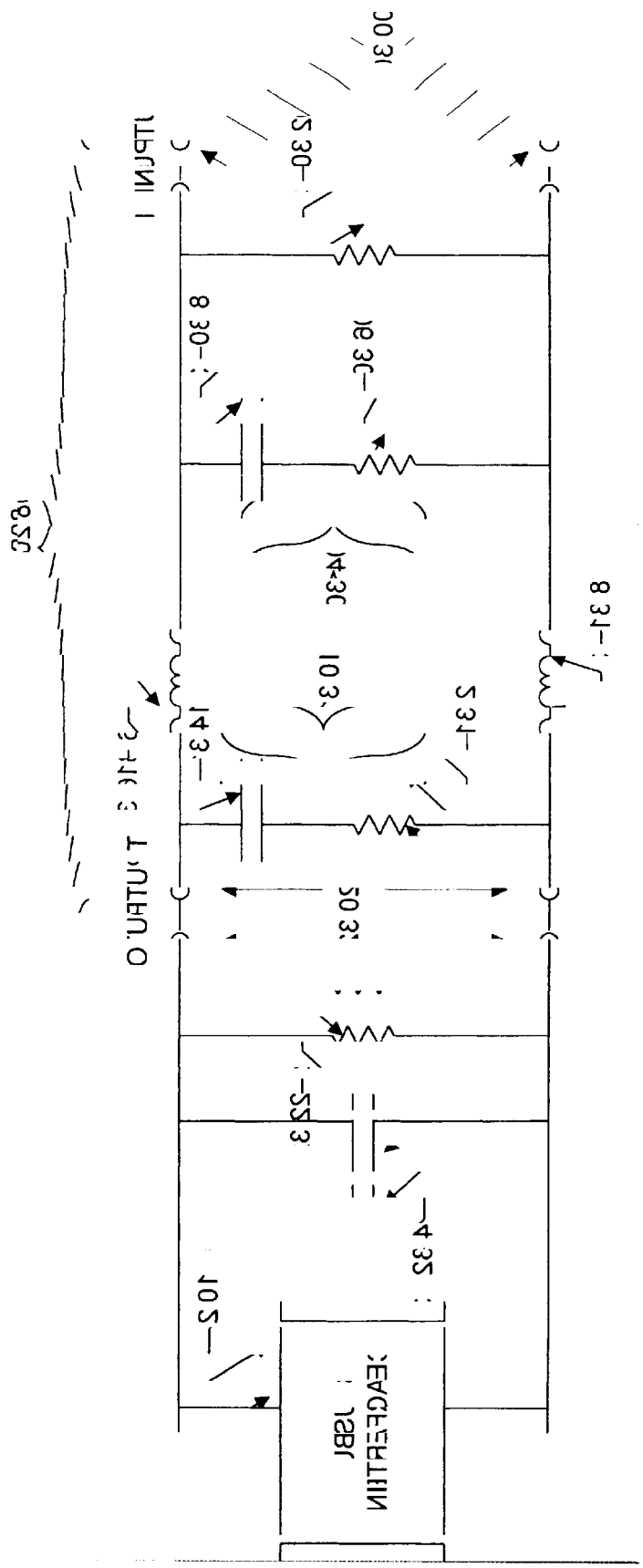
FIG. 3 is a schematic diagram of a passive filter used within the 10/100 network interface in accordance with the invention.

In accordance with the principles of the invention, the passive receive filter 301 is provided to have a substantially constant input impedance over the operational frequency range of the 100Base-TX signal. This constant input impedance preferably matches the impedance of the input line 204, thereby eliminating distortion and limiting attenuation of the 100Base-TX signal transmitted to the encoder/decoder 206 from the input port 202. Many passive filters can be used to effectuate this function. FIG. 3, for example, schematically shows a 10Base-T receive filter 301 constructed in accordance with the principles of the invention. More particularly, the filter 301 is made entirely of passive electronic elements that are configured to effectively filter a 10Base-T signal when a 10Base-T signal is received at the input port 202. The filter 301 also is designed to have an input impedance that will not attenuate or distort a 100Base-TX signal transmitted between the input port 202 and the encoder/decoder 206. No active electronic elements, which generally are more expensive than passive electronic elements, are included in the filter 301.

In the preferred embodiment, the receive filter 301 is a differential filter having a differential input port 300 in parallel with a first resistor 302. The filter 301 also includes a first RC pair 304 comprising a second resistor 306 and a first capacitor 308, and a second RC pair 310 similarly comprising a third resistor 312 and a second capacitor 314. The first RC pair 304 is connected in parallel with the second RC pair 310 by a first inductor 316 and a second inductor 318. The filter 301 further includes a differential output port 320, which is connected in parallel to both the second RC pair 310, a fourth resistor 322 (external to the filter 301), and the PCI-bus interface 210. Third and fourth capacitors 324 and 326 also may be serially connected to each differential output 320 for DC blocking.

It is preferred that the input impedance of the 10Base-T receive filter 301 match the impedance of the input line 204 between the operational frequency range of a 100Base-TX signal. Such frequencies in the operating frequency range typically are between about two and eighty megahertz. This impedance match should eliminate reflections in the input line 204, thus eliminating distortion of a 100Base-TX signal transmitted to the encoder/decoder 206 from the input port 202. This impedance match also can limit attenuation of the 100Base-TX signal transmitted to the encoder/decoder 206 from the input port 202.

In the preferred embodiment, the encoder/decoder 206 is a model 6694 or a 6698 chip, available from Microlinear Corporation of San Jose, Calif., and the PCI-bus interface 210 is a 21143 PCl/CARDBUS 10/100-MB/S Ethernet LAN controller, available from Digital Equipment Corporation of Maynard, Mass. The line impedance of the input line 204 of the preferred embodiment over the expected operating frequencies typically is about 100 ohms. In combination with these network interface elements, it has been found that the following values for the elements of the receive filter 301 produce satisfactory results:

first resistor 302: 200 ohms;
second resistor 306: 200 ohms;
third resistor 312: 200 ohms;
fourth resistor 322: 200 ohms;
first capacitor 308: 27 picofarads;
second capacitor 314: 1.8 picofarads;
third capacitor 324: 0.01 microfarads;
fourth capacitor 324: 0.01 microfarads;
first inductor 316: 0.68 microhenries; and
second inductor 318: 0.68 microhenries.

Figure 4:
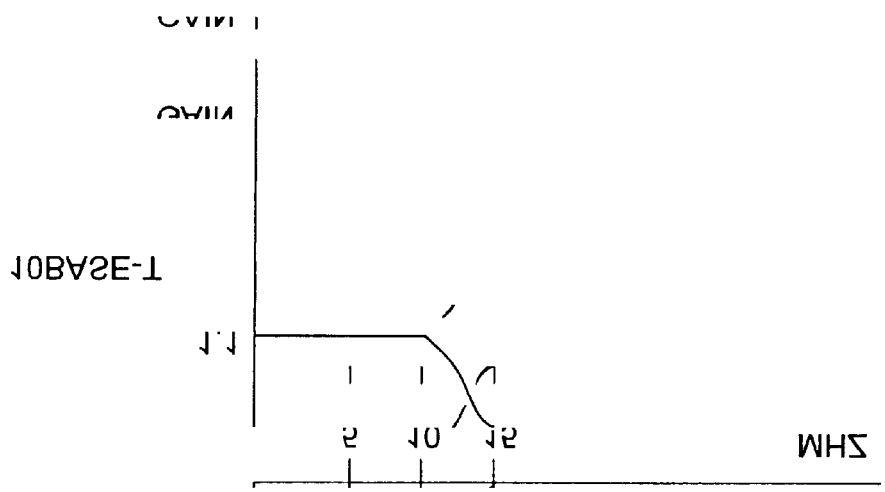
FIG. 4 is an exemplary graphical display of the attenuation of the passive filter shown in FIG. 3.

The preferred embodiment of the receive filter 301 should have a gain that approximates its ideal gain. Specifically, FIG. 4 graphically shows the ideal gain for the filter 301 over the operational frequency range for a 10Base-T signal. Since the operating frequencies of such a signal are between about five and ten megahertz, the gain preferably is constant for all 10Base-T signals having frequencies between those operating frequencies. Although FIG. 4 shows the gain as being 1.0 between the 10Base-T operating frequencies, gains between about 0.9 and 1.0 for those frequencies also should produce satisfactory results. Since the function of the receive filter 301 is to process only 10Base-T signals transmitted to the bus interface 210 through the filter 301, it is preferred that the filter 301 attenuate such signals operating at frequencies that are greater than about fifteen megahertz.

Figure 5:
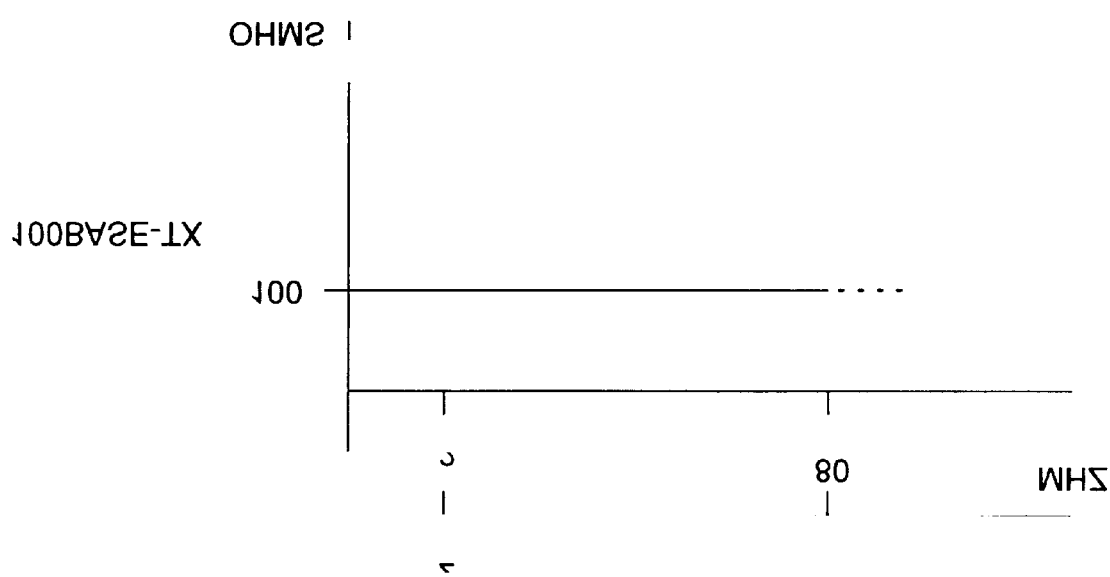
FIG. 5 is an exemplary graphical display of the input impedance of the passive filter shown in FIG. 3.
Figure 1:
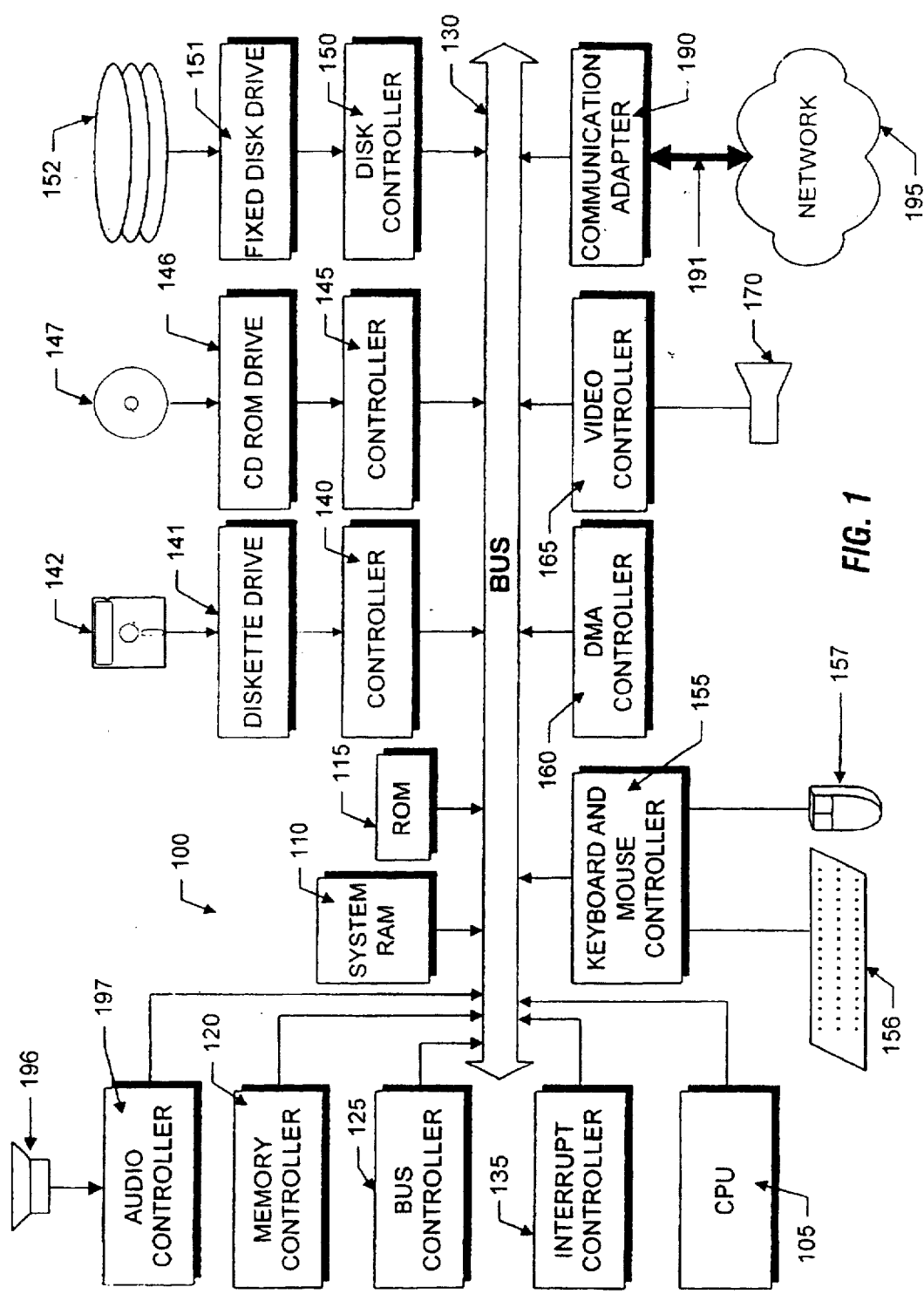
Figure 2:
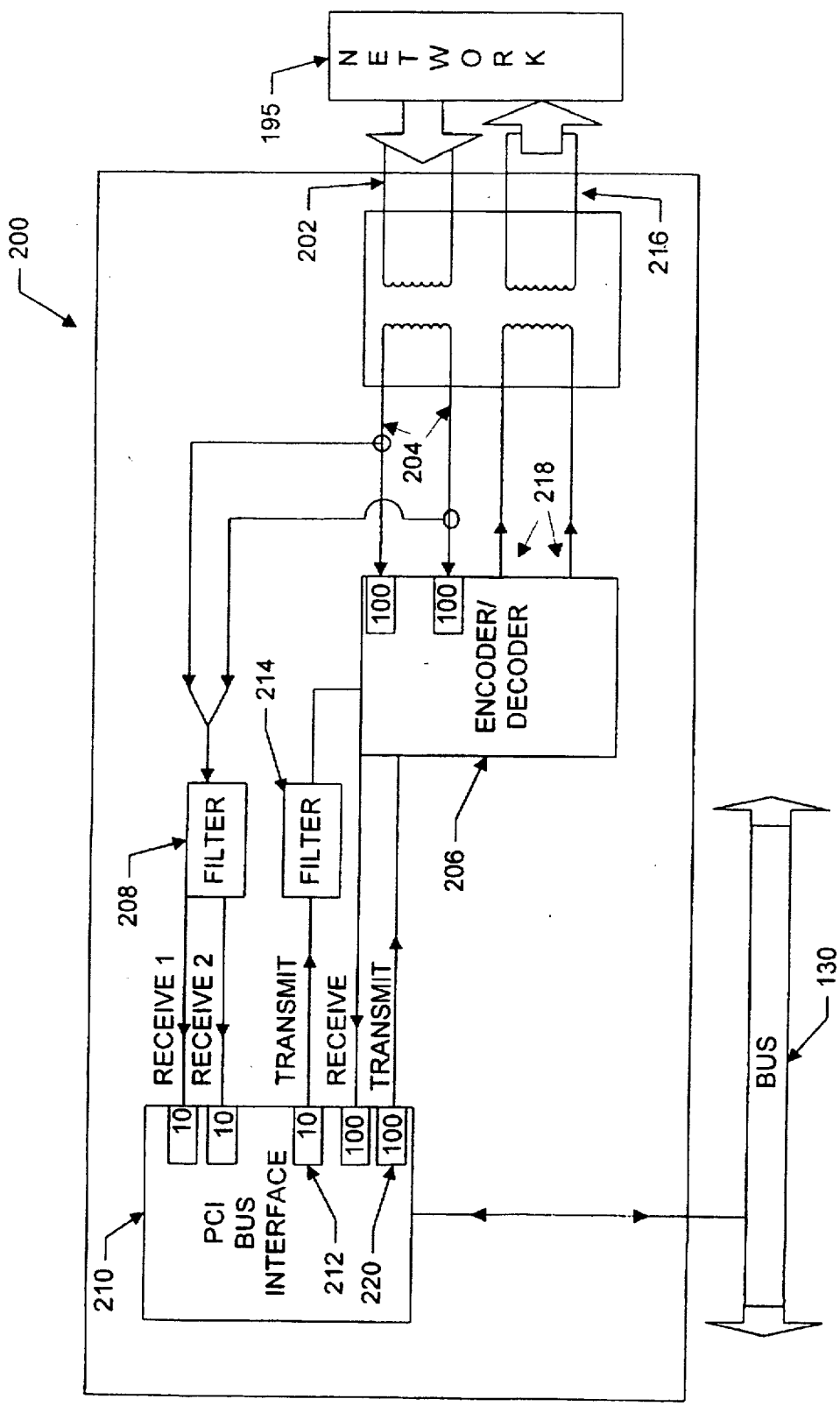
Figure 3:
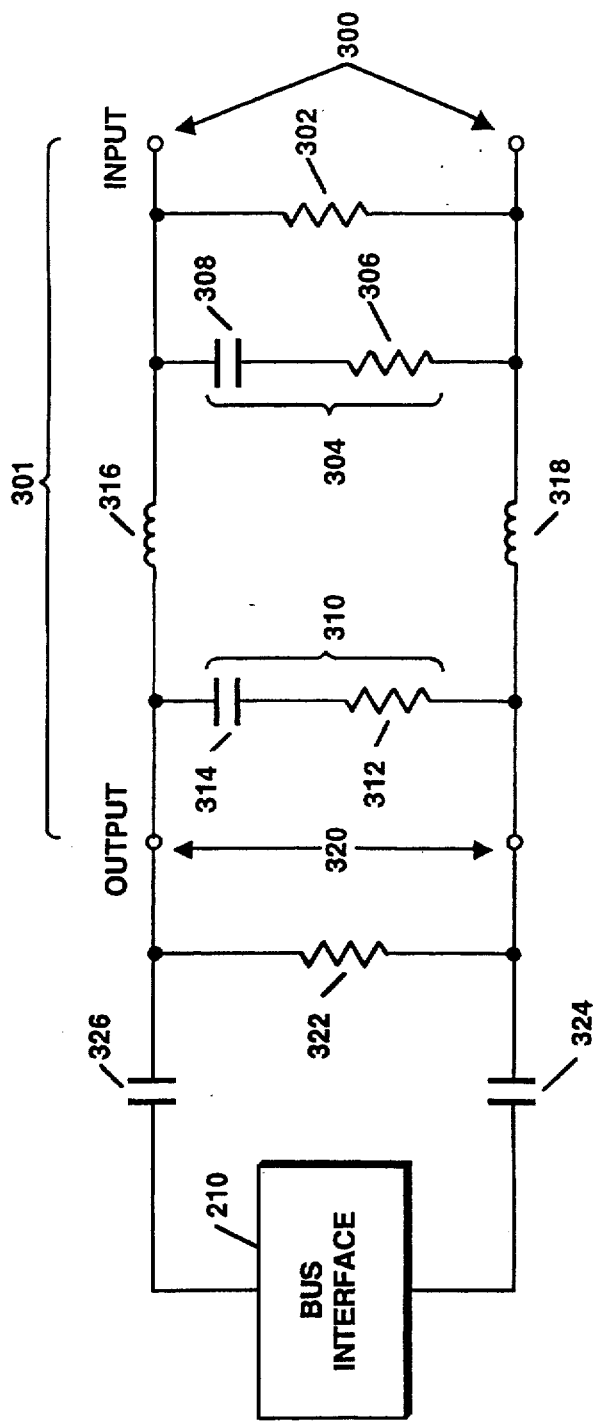
Figure 5:
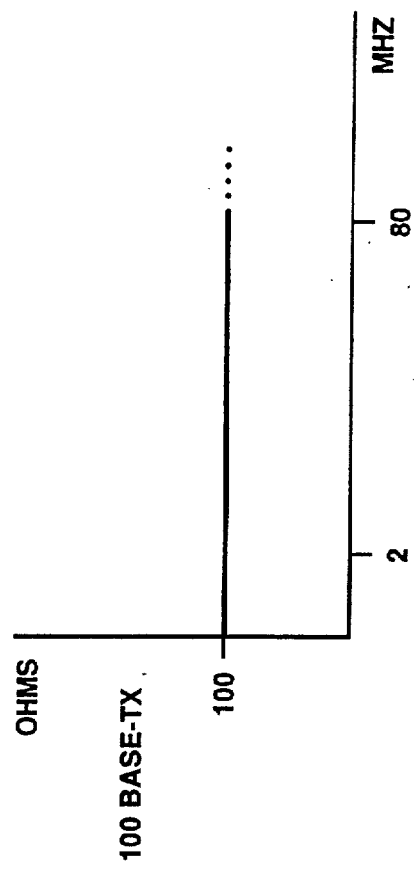
Figure 4:
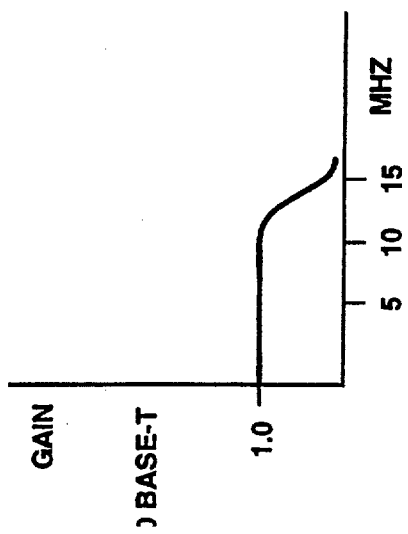

FIG. 5 graphically shows the ideal input impedance of the receive filter 301 over the operational frequency range of a 100Base-TX signal. Specifically, the input impedance preferably is approximately 100 ohms over all frequencies between about two and eighty megahertz. This impedance matches the line impedance, thus preventing a 100Base-TX signal from being distorted when transmitted to the encoder/decoder 206. The graphical representation of the preferred embodiment of the receive filter 301 described above should approximate the ideal impedance graphically shown in FIG. 5.

The inventive receive filter 301 therefore is constructed to effectively filter noise from a 10Base-T signal when a 10Base-T signal is received, and to not distort a 100Base-TX signal transmitted between the input port 202 and the encoder/decoder 206. The filter 301 provides these dual functions at a substantially lower cost than known active filters currently used for these functions.

While the invention has been shown and described above with respect to various preferred embodiments, it will apparent that the foregoing and other changes of the form and detail may be made therein by one skilled in the art without departing from the spirit and scope of the invention. For example, in an alternative embodiment of the invention, the inventive network interface 200 may be modified to be used with known network protocols that were not previously discussed. These and other obvious modifications are intended to be covered by the following claims.

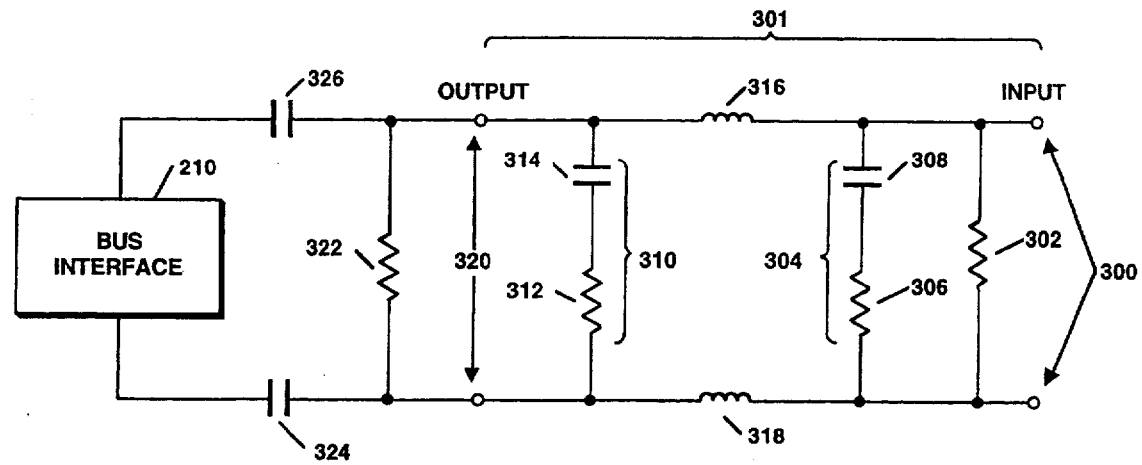

What is claimed is:

1. A network interface for receiving either a high speed data signal or a low speed data signal, the high speed data signal having an operational frequency range, the network interface comprising:

an input port for receiving an input signal, the input signal being either the high speed data signal or the low speed data signal; and a passive filter for filtering the input signal, the filter transmitting the low speed data signal and being substantially free of active electronic elements, the passive filter having a substantially constant input impedance over the operational frequency range of the high speed data signal being attenuated.

2. The interface as defined by claim 1 further including an input line connected to the input port, the filter being connected in parallel with the input line, the filter having an input impedance that is approximately equal to the impedance of the input line over a selected frequency range.

3. The interface as defined by claim 1 wherein the filter includes a resistor and a capacitor.

4. The interface as defined by claim 1 wherein the filter includes a resistor and an inductor.

5. The interface as defined by claim 1 wherein the filter includes a resistor, a capacitor, and an inductor.

6. The interface as defined by claim 1 wherein the low speed signal is a 10Base-T signal and the filter is a low-pass filter having a substantially constant gain between approximately five and ten megahertz, the substantially constant gain being between approximately 0.9 and 1.0.

7. The interface as defined by claim 1 wherein the high speed signal is a 100Base-TX signal and the filter has an input impedance that is substantially constant between approximately two and eighty megahertz.

8. The interface as defined by claim 1 further including an input line connected to the input port and wherein the filter consists of passive electronic elements that are selected to produce a substantially constant input impedance at the input port between selected frequencies, the selected frequencies being between approximately two and eighty megahertz, the substantially constant input impedance being approximately equal to the impedance of the input line.

9. A network interface for a computer bus for interfacing with a network, the network interface receiving either a high speed network signal or a low speed network signal, the high speed network signal having operating frequencies, the network interface comprising:

an input line for transmitting an input network signal from an input;

an encoder/decoder for processing the input network signal, the encoder/decoder being in electrical communication with the input line and processing high speed network signals only;

a passive filter, in electrical communication with the input line, for filtering the input network signal to produce a filtered input network signal, the filter transmitting low speed signals and consisting of passive electronic elements, the passive filter having a substantially constant input impedance over the operating frequencies of the high speed network signal being attenuated; and a bus interface for receiving the filtered input network signal and transmitting the filtered input network signal to the bus.

10. The network interface as defined by claim 9 wherein the passive filter is connected to the input line in parallel, the passive filter having an input impedance, the input line having an impedance, the filter input impedance being approximately equal to the input line impedance over a selected frequency range.

11. The network interface as defined by claim 10 wherein the selected frequency range is between approximately two and eighty megahertz.

12. The network interface as defined by claim 9 wherein the input network signal is a 10Base-T signal and the filter is a low pass filter having a substantially constant gain between approximately five and ten megahertz, the substantially constant gain being between approximately 0.9 and 1.0.

13. The network interface as defined by claim 9 wherein the input network signal is a 100Base-TX signal and the filter has an input impedance that is substantially constant between approximately two and eighty megahertz.

14. The network interface as defined by claim 9 wherein the filter includes a resistor and a capacitor.

15. The network interface as defined by claim 9 wherein the filter includes a resistor and an inductor.

16. The network interface as defined by claim 9 wherein the filter includes a resistor, a capacitor, and an inductor.

17. The network interface as defined by claim 9 wherein the filter has differential inputs.

18. A network interface for connecting a high speed network signal and a low speed network signal to a computer bus, the high speed network signal having a plurality of operating frequencies, the network interface comprising:

means for receiving an input signal from an input, the receiving means including an input line;

means for decoding the input signal when the input signal is a high speed signal;

means for filtering the input network signal to produce a filtered input signal when the input signal is a low speed network signal, the filtering means being free of active electronic elements, the filtering means having a substantially constant input impedance over the plurality of operating frequencies of the high speed network signal being attenuated; and means for interfacing the filtered input signal with the computer bus.

19. The network interface as defined by claim 18 wherein the filtering means includes an input impedance and the input line includes a line impedance, the filter input impedance being substantially equal to the line impedance over a selected frequency range.

20. The network interface as defined by claim 18 wherein the input signal is a 10Base-T signal and the filtering means is a low-pass filter having a substantially constant gain between approximately five and ten megahertz, the substantially constant gain being between approximately 0.9 and 1.0.

21. The network interface as defined by claim 18 wherein the input signal is a 100Base-TX signal and the filtering means includes an input impedance that is substantially constant between approximately two and eighty megahertz.

* * * * *

UNITED STATES PATENT AND TRADEMARK OFFICE
CERTIFICATE OF CORRECTION

PATENT NO. : 6,014,409
DATED : January 11, 2000
INVENTOR(S) : Robert Curtis

It is certified that error appears in the above-identified patent and that said Letters Patent is hereby corrected as shown below:

The title page, showing the illustrative figure, should be deleted to appear as per the attached title page.

The Drawing Sheets, consisting of Figs. 1 through 5, should be deleted to be replaced with the Drwing Sheets, consisting of Figs. 1-5, as shown on the attached page.

Signed and Sealed this

Twenty-ninth Day of August, 2000

Attest:

Q. TODD DICKINSON

Attesting Officer

Director of Patents and Trademarks

United States Patent [19]

Curtis

[11] Patent Number: 6,014,409
[45] Date of Patent: Jan. 11, 2000

[54] PASSIVE ANALOG FILTER FOR NETWORK INTERFACE

[75] Inventor: Robert Curtis, Hudson, Mass.

[73] Assignee: Cabletron Systems, Inc., Rochester, N.H.

[21] Appl. No.: 08/796,072

[22] Filed: Feb. 5, 1997

[51] Int. Cl.[7] .................. H04B 3/00; H04B 3/04; H04L 25/00; H03H 7/38
[52] U.S. Cl. .................. 375/257; 375/258; 333/20; 333/32; 333/167; 333/172; 333/177
[58] Field of Search .................. 375/257, 258; 333/20, 32, 167, 172, 177, 178

[56] References Cited

U.S. PATENT DOCUMENTS

| | | | |
|---|---|---|---|
| 4,875,223 | 10/1989 | Curtis | 375/258 |
| 5,410,535 | 4/1995 | Yang et al. | |
| 5,541,957 | 7/1996 | Lau | 375/258 |
| 5,544,323 | 8/1996 | Heaton et al. | 395/200.14 |
| 5,577,069 | 11/1996 | Lau et al. | |
| 5,586,117 | 12/1996 | Edem et al. | |
| 5,596,575 | 1/1997 | Yang et al. | 370/468 |
| 5,715,287 | 2/1998 | Wadhawan et al. | 375/377 |
| 5,739,707 | 4/1998 | Barraclough | 327/112 |
| 5,747,893 | 5/1998 | Bennett et al. | 307/100 |
| 5,754,552 | 5/1998 | Allmond et al. | 370/465 |
| 5,764,394 | 6/1998 | Yamazaki et al. | 359/152 |
| 5,784,408 | 7/1998 | Lau | 375/258 |
| 5,799,040 | 8/1998 | Lau | 375/258 |

OTHER PUBLICATIONS

"Hybrid Buterworth Filter Module," IBM Technical Disclosure Bulletin, vol. 28, No. 5, Oct. 1985, New York USA, pp. 2164–2165, XP002067554.

*Asante 100 Megabit Fast Ethernet White Paper,* Asante and 100BASE–T Fast Ethernet, *A Whitepaper by Asante Technologies, Inc.;* pp. 1–6, Jan. 14, 1997, http://www.asante.com/Press/wpfast.html, Copyright 1994–1995.

*Primary Examiner*—Stephen Chin
*Assistant Examiner*—Michael W. Maddox
*Attorney, Agent, or Firm*—Wolf, Greenfield & Sacks, P.C.

[57] ABSTRACT

A network interface for receiving both high speed signals and low speed signals includes a passive filter manufactured entirely from passive electronic elements. The filter filters the low speed signal when a low speed signal is received, and does not distort a high speed signal transmitted to an encoder/decoder device when a high speed signal is received.

21 Claims, 4 Drawing Sheets